United States Patent
Hausler

(10) Patent No.: US 9,891,082 B2
(45) Date of Patent: Feb. 13, 2018

(54) VIBRATION RESISTANT MOUNT FOR METER USED IN INDUSTRIAL FIELD DEVICES

(71) Applicant: Rosemount Inc., Chanhassen, MN (US)

(72) Inventor: George Charles Hausler, Maple Grove, MN (US)

(73) Assignee: Rosemount Inc., Chanhassen, MN (US)

( * ) Notice: Subject to any disclaimer, the term of this patent is extended or adjusted under 35 U.S.C. 154(b) by 180 days.

(21) Appl. No.: 14/501,973

(22) Filed: Sep. 30, 2014

(65) Prior Publication Data

US 2015/0354998 A1    Dec. 10, 2015

Related U.S. Application Data

(60) Provisional application No. 62/009,685, filed on Jun. 9, 2014.

(51) Int. Cl.
*G01D 11/24* (2006.01)
*G01D 11/30* (2006.01)
*H05K 7/14* (2006.01)

(52) U.S. Cl.
CPC ............ *G01D 11/30* (2013.01); *G01D 11/24* (2013.01); *H05K 7/1462* (2013.01)

(58) Field of Classification Search
CPC ...... G01D 11/24; G01D 11/30; G01D 11/245; G01D 11/26
See application file for complete search history.

(56) References Cited

U.S. PATENT DOCUMENTS

| | | | |
|---|---|---|---|
| 5,570,176 A | 10/1996 | Noel | |
| 7,134,354 B2 | 11/2006 | Nelson et al. | |
| 8,315,058 B2 | 11/2012 | Schwartz et al. | |
| 8,334,788 B2 | 12/2012 | Hausler et al. | |
| 8,336,408 B2* | 12/2012 | Hershey | G01D 7/00 29/593 |
| 8,570,260 B2 | 10/2013 | Hedtke et al. | |
| 2004/0045380 A1 | 3/2004 | Nelson et al. | |
| 2012/0055274 A1 | 3/2012 | Hershey et al. | |

FOREIGN PATENT DOCUMENTS

| CN | 100373135 C | 3/2008 |
|---|---|---|
| CN | 102402324 | 4/2012 |

OTHER PUBLICATIONS

Notification of Transmittal of the International Search Report and the Written Opinion of the International Searching Authority from PCT/US2015/027291, dated Aug. 24, 2015.
Communication from European Patent Application No. 15723354.5, dated Jan. 17, 2017.
Office Action from Chinese Patent application No. 201510028639.5, dated Apr. 5, 2017.
Office Action from Japanese Patent application No. 2016-572243, dated Nov. 8, 2017.

\* cited by examiner

*Primary Examiner* — Justin Olamit
(74) *Attorney, Agent, or Firm* — Westman, Champlin & Koehler, P.A.

(57) ABSTRACT

A field device includes a housing and a process variable transducer configured to measure or control a process variable in an industrial process. Field device circuitry in the housing is coupled to the process variable transducer. A meter body mount is carried in housing. A meter is affixed to the meter body mount by an attachment mechanism. The meter includes a display element. A cover seals the meter in the housing.

13 Claims, 7 Drawing Sheets ized on and claims the benefit
VIBRATION RESISTANT MOUNT FOR METER USED IN INDUSTRIAL FIELD DEVICES

CROSS-REFERENCE TO RELATED APPLICATION

The present application is based on and claims the benefit of U.S. provisional patent application Ser. No. 62/009,685, filed Jun. 9, 2014, the content of which is hereby incorporated by reference in its entirety.

BACKGROUND

The present invention relates to industrial process control transmitters of the type used in industrial process or monitoring systems. More specifically, the present invention relates to industrial process control transmitters which include a meter used to display information.

Industrial process control transmitters are used in industrial processes to measure a process variable. Examples of process variables include temperature, pressure, flow rate, level, pH, etc. Typically, the process control transmitters are located at remote locations and sends information to a centralized location such as a control room. Some industrial process control transmitters also include a local meter for displaying information on the transmitters. The meter can be used to display process variable information, configuration information, menus or the like for use in commissioning or modifying a transmitter configuration, or alarm related information, or other information to an operator. A controller is an example of another type of field device used in an industrial process control systems. Controllers are used to control a process variable, for example, a valve may be used to adjust the flow rate of a process fluid, a heating element may be activated to increase temperature of a process fluid, etc. These types of field devices may also include a meter for displaying information locally to an operator.

In many instances, process control transmitters are located in harsh environments. The meter must be secured in the process variable transmitter in a manner which is appropriate for use in such environments.

SUMMARY

A field device includes a housing and a process variable transducer configured to measure or control a process variable in an industrial process. Field device circuitry in the housing is coupled to the process variable transducer. A meter body mount is carried in housing. A meter is affixed to the meter body mount by snap-in attachment mechanism The meter includes a display element. A cover seals the meter in the housing.

DETAILED DESCRIPTION OF ILLUSTRATIVE EMBODIMENTS

Industrial measurement transmitters and controllers (field devices) often contain a meter which carries a display which is viewable through a clear viewing port in the housing of the device. A recent vibration standard for measurement transmitters requires that the meter be contained in an explosion proof housing capable of withstanding up to 5 g's of vibration force (up to 50 g's in actual testing may arise due the amplification effect created by the manner in which the transmitter is mounted) with little or no wear to the electrical connectors, or to the meter itself Further, in some configurations, the functions and programming of the meter may be accessed through the viewing port using a touch screen. In order for the touch screen type of interface to function in this device, the face of the meter must be in direct contact with the meter cover glass. Any air gap between the front of the meter face and the glass will interfere with the touch screen interface.

Figure 1:
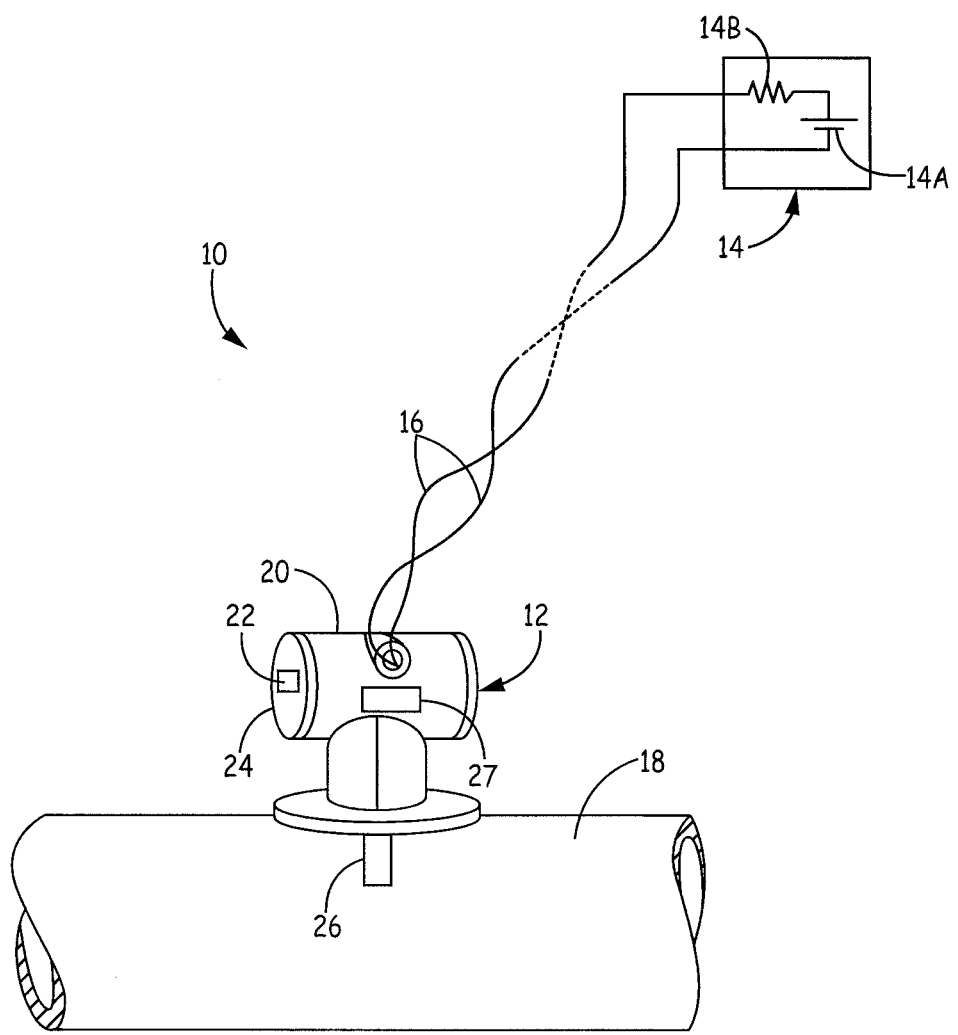
FIG. 1 is a simplified diagram of an industrial process including a process variable transmitter in accordance with the present invention.

Embodiments of the invention provide a field device such as process variable transmitter which includes a meter for displaying information locally. The transmitter is configured to transmit information to another location such as a control room, while the transmitter itself is located remotely. FIG. 1 is a simplified diagram showing an industrial process control or monitoring system 10 for use in monitoring or controlling a process fluid in an industrial process. In FIG. 1, a transmitter 12 is shown as being coupled to control room 14 by two wire process control loop 16. However, other communication techniques can be employed such as wireless techniques, other wiring configurations, etc. Typical two wire process control loops include 4-20 mA control loops which may carry digital information, in addition to, or as an alternative to, analog data carried as an analog current representation. Process control room 14 is illustrated as a power supply (voltage source) 14A and a resistance 14B. The same two wire process control loop can also be used as the sole source of power for electrical circuitry in the transmitter 12. Additionally, the communication may be over a wireless process control loop in which information is transmitted wirelessly using, for example, RF communication techniques such as that provided by Wireless HART® in accordance with the IEC 62591 standard.

The process variable transmitter 12 is shown coupled to process piping 18 and is configured, in this embodiment, to measure a process variable of a process fluid in piping 18 using process variable sensor 26. Example process variables include temperature, pressure, flow, level, etc. Although a transmitter is specifically discussed above, device 12 may be any type of field device including a process variable controller. Both a transmitter and a process controller include process interface element 26 coupled to field device circuitry 27 which is used to monitor or control a process variable. In the case of a process variable transmitter, element 26 is a process variable sensor. For a process controller, element 26 is some type of a control element such as a valve, heating element, etc.

FIG. 1 shows process variable transmitter 12 as including a housing 20 with a meter 22 having a display element 60 (see FIG. 5) visible through a window 76 in a cover 24. Window 76 can comprise glass or some other compatible transparent material. The configuration of the meter 22 according to various embodiments, is described below in more detail. The meter 22 is preferably mounted in an explosion proof electronics housing 20 that can withstand a 5 g vibration test (up to 50 g's due to the manner in which a transmitter may be mounted). The meter should also remain in contact with the window 76 carried by the cover. The mounting mechanism preferably generates a clamping force of at least 15 pounds between the meter and the window 76. With the cover removed, the meter 22 is preferably retained in the housing 20 such that electrical connections are maintained. The mount preferably manages positioning variations due to multiple components stacked together with varying tolerances and still provide the desired clamping force. The meter 22 is preferably easy to install and remove from the housing 20. In one aspect, a compressive force of up to 50 pounds between the meter 22 and window 76 is provided. A substantial amount of force is required to maintain the meter 22 in contact with the window 76 in high vibration environments.

Figure 2:
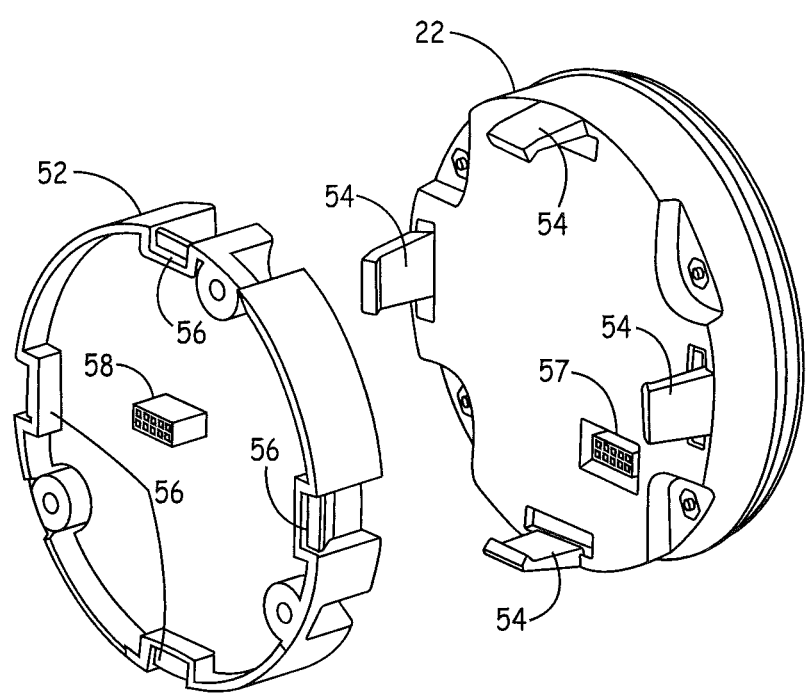
FIG. 2 is an exploded view showing a meter body mount and meter in accordance with one configuration.

FIG. 2 is a perspective view showing meter 22 positioned adjacent a meter body mount 52. Meter 22 includes four spring clips 54 which are configured to clip to spring clip receptacles 56 in meter body mount 52. Body 52 includes electrical connector 57 for electrically coupling to meter body mount 52. Similarly, electrical connector 58 is used for electrically coupling mount 52 to electrical circuitry 27 of transmitter 12.

Figure 3:
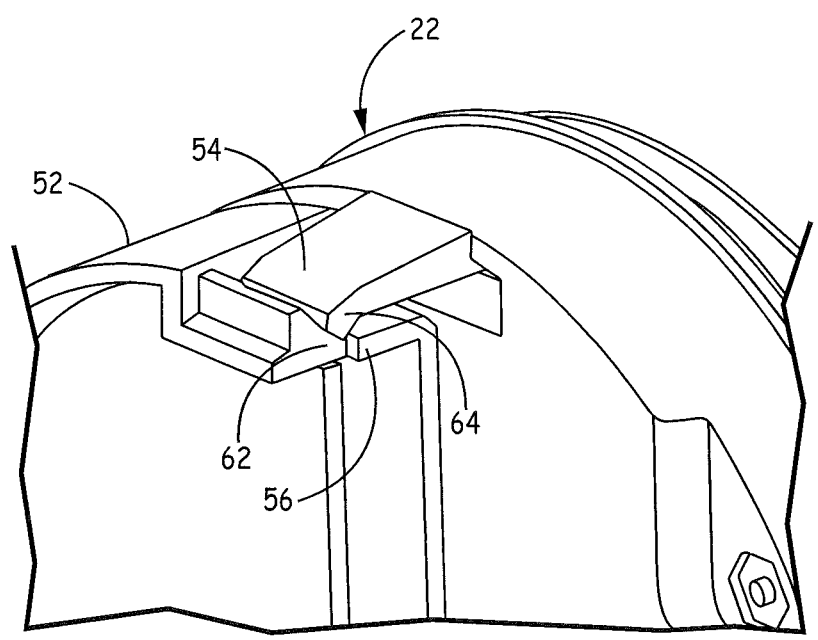
FIG. 3 is a perspective view showing the meter body mount mounted to the meter.
Figure 4:
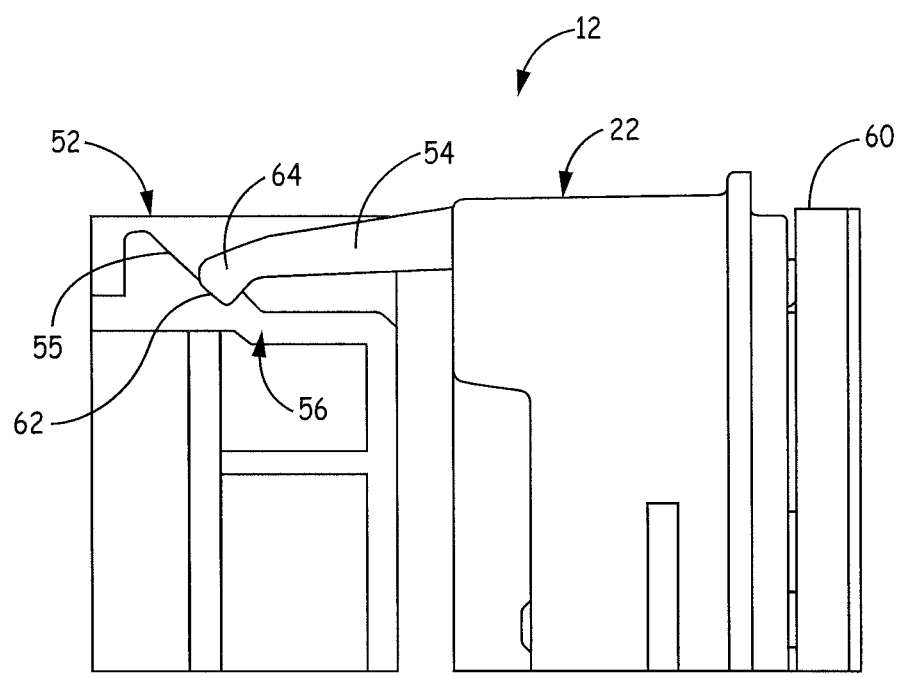
FIG. 4 is a cross sectional view showing a detent.

FIG. 3 is an enlarged perspective view and FIG. 4 is a side cross-sectional view showing the meter 22 mounted to the meter body mount 52, according to one embodiment. As illustrated in FIG. 4, meter 22 includes a display element 60 which, in one configuration, is a touch sensitive display. Display element 60 couples to field device circuitry 27 shown in FIG. 1. As illustrated in FIGS. 3 and 4, spring clip receptacles 56 include a detent 62 arranged to receive a protrusion 64 on clip 54.

Figure 5:
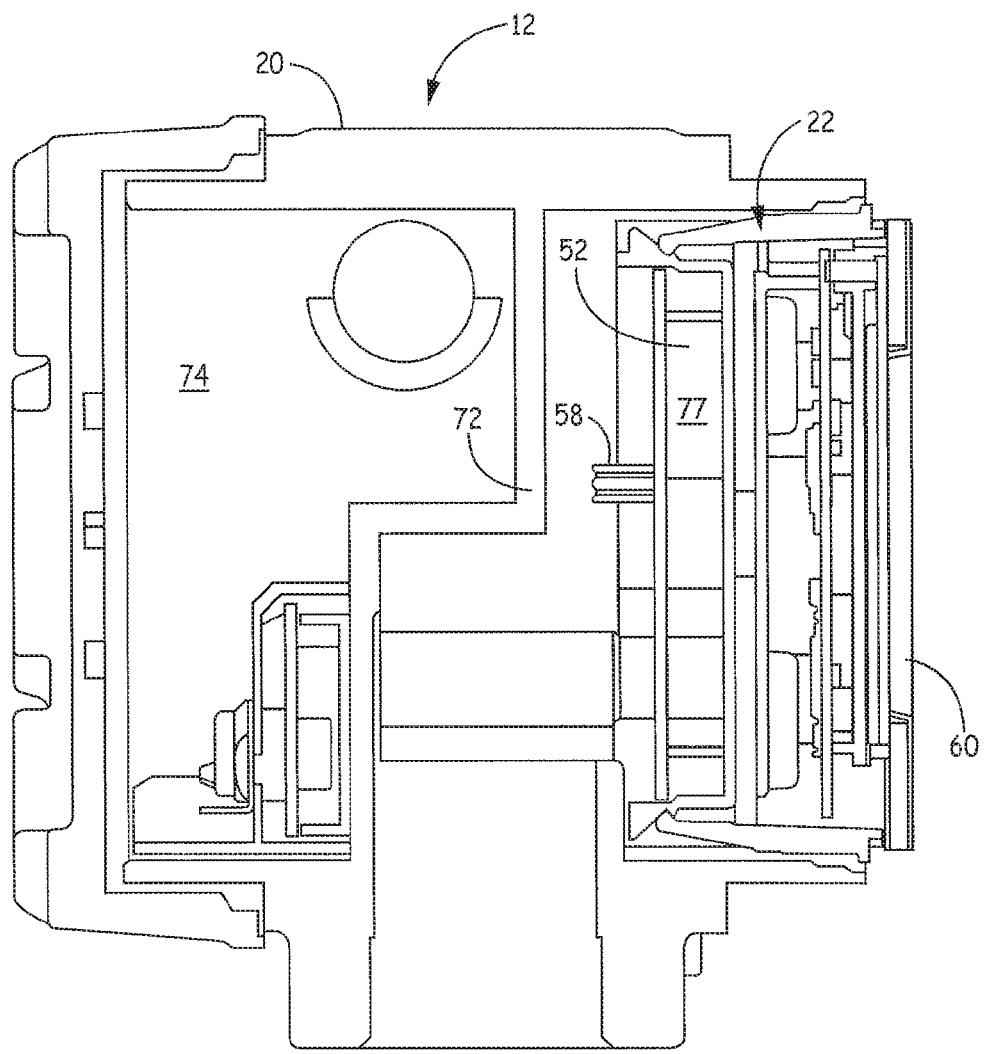
FIG. 5 is a cross sectional view of a process variable transmitter prior to mounting a cover.

The spring clips 54 secure the meter 22 the meter body mount 52 whereby the meter 22 is held securely in place if the cover 24 of transmitter 12 is removed as illustrated in FIG. 5. FIG. 5 is a cross-sectional view of transmitter 12 with cover 24 removed. FIG. 5 also illustrates the configuration of the housing 20 of the transmitter 12 in which an interior wall 72 divides an interior cavity of the transmitter into two regions 74 and 77.

Figure 6:
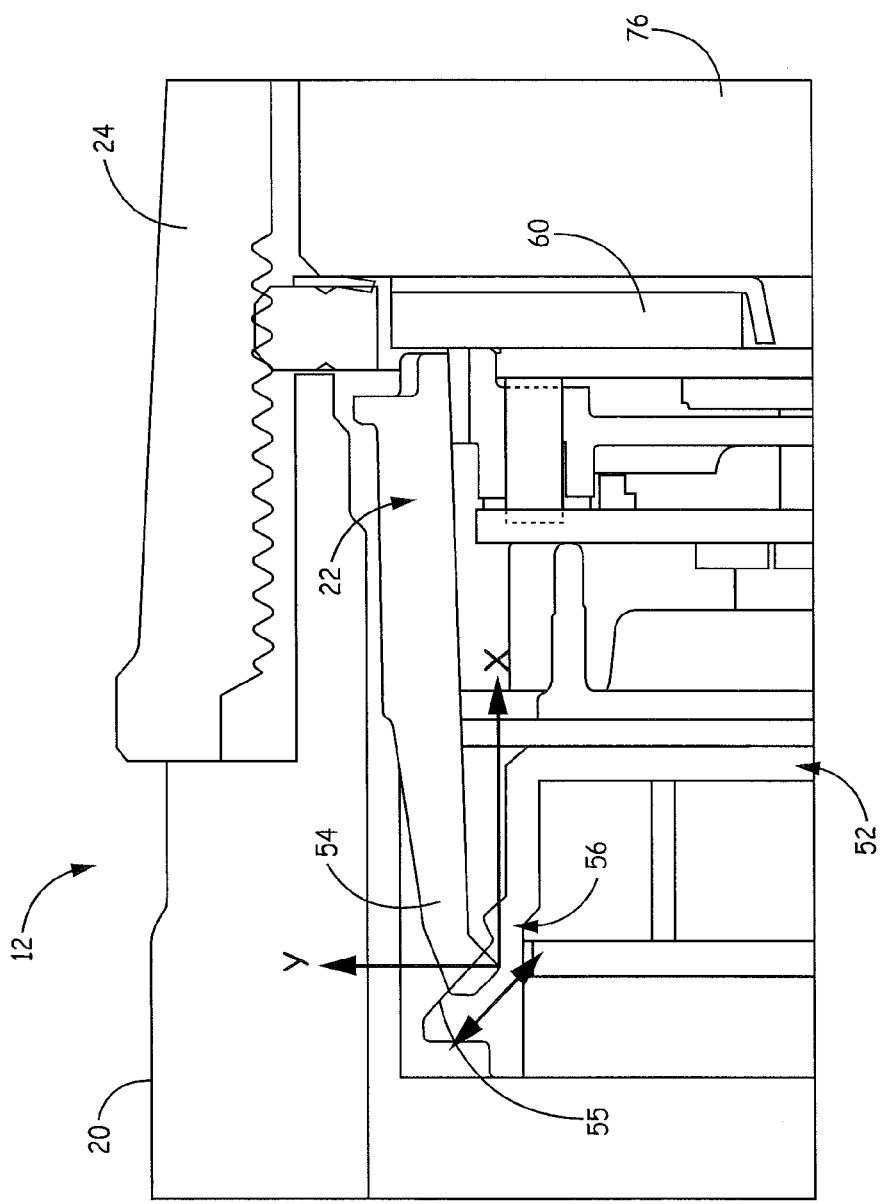
FIG. 6 is a cross sectional view showing forces due to clamping of the meter to the meter.

When the meter cover 24 is installed (FIG. 6), and fully tightened, the window 76 presses against the meter 22 causing the spring fingers 54 to be forced outwards in the direction "Y" by the ramp 55 formed by detent 62 in the meter body mount 52. As illustrated in FIG. 6, this generates large forces in both the "X" and "Y" directions. The forces in both directions can be modified by changing the angle of the ramp 55. With the ramp 55 at an angle of about 45 degrees relative to the "X" axis, over 55 lbs. of force can be generated in the "X" direction. A minimum of 12 lbs. of force is preferred in the "X" direction when subject to 50 g's vibration force in order to keep the meter 22 secured tightly against the meter window 76. This configuration also prevents motion in the "Y" direction. Testing can be used to determine the minimum force required to prevent the meter 22 from vibrating within the housing 20.

In the configurations shown above, a large clamping force is generated in a relatively compact design. The clamping force is adjustable from zero to over 50 pounds as desired. The force generating mechanisms can be integrated into an injection molded shroud for both the meter and the meter body mount. This fabrication technique does not require additional parts such as metal springs. The attachment mechanism generates forces in both the X and Y directions. This allows the meter to be stabilized in two directions. The spring clips retain the meter within the transmitter housing before the cover is tightened down. Further, this configuration allows the meter to be electrically connected to transmitter electronics whereby the meter is operable before the cover is applied. The spring fingers also prevent the meter from rotating with respect to the transmitter housing as the meter cover is tightened and the glass brought into contact with the display.

Figure 7:
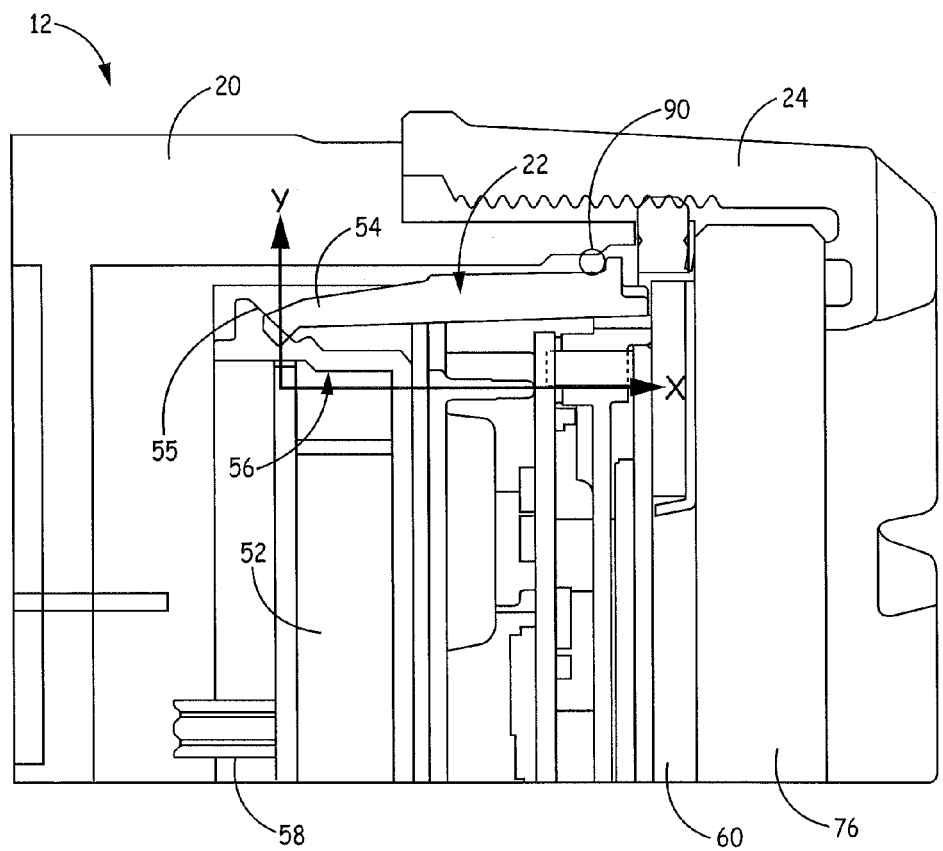
FIG. 7 is a cross sectional view of the transmitter showing positioning of an o-ring.

FIG. 7 is a cross-sectional view of a portion of transmitter 12. In the configuration of FIG. 7, an O-ring 90 is provided. O-ring 90 provides additional stability to the meter 22 in the Y direction with respect to the housing 20.

Although the present invention has been described with reference to preferred embodiments, workers skilled in the art will recognize that changes may be made in form and detail without departing from the spirit and scope of the invention. The meter, meter body mount, and other components may be formed out of any appropriate material. These include metal, plastics, combinations thereof, or other materials. The materials selected should have the desired characteristics including elasticity, hardness, or other characteristics. Depending on the fabrication technique, the various components can be formed through a molding process. In addition to the display element 60, the meter 22 may include other electrical components such as electrical circuitry configured to drive the display element 60, or other components as desired. Similarly, the meter body mount 52 may optionally include electrical components. Circuit boards or other components can be used to support such electrical circuit elements in the meter 22 or in the meter body mount 52. As used herein, the spring clip and spring clip receptacles provide one example of a snap-in attachment mechanism. However, other snap-in attachment mechanisms are also contemplated in which forces in the X and/or Y directions are applied to the meter to secure the meter within a field device housing. As illustrated herein, the spring clips and spring clips receptacles are radially spaced around a circular meter and meter body mount. At least two such spring clips and spring clip receptacles may be implemented to mount the meter to the meter body mount. When oriented at 180° spacing (a radially opposed spacing) the spring clips will provide an opposing force to one another. The window in the field device cover provides a transparent region for viewing the display element through the cover. In such a configuration, the display element may also be touch sensitive, for example using capacitive or resistive techniques, whereby a user input may be received by the display element through the transparent region. As used herein, the "X" direction is oriented parallel to an axis of a cylindrical field device housing. Further, the "Y" direction is perpendicular to the "X" direction and may be, for example, oriented radially with respect to a circular housing. Although the spring clip is illustrated as being carried on the meter and the spring clip receptacle is illustrated as being carried on the meter body mount, an opposite configuration may also be implemented. The display element 60 can be any appropriate display element including LED, liquid crystal, or other configuration. In one configuration, the housing and the meter are cylindrical. In such a configuration, the Y direction illustrated in figures corresponds to a radial direction. Although any number of attachment mechanisms may be implemented, if at least three attachment mechanisms are employed, the meter will be secured in three dimensions, X, Y and Z.

What is claimed is:

1. A field device, comprising:
   a housing;
   a process variable transducer configured to measure or control a process variable in an industrial process;
   field device circuitry in the housing coupled to the process variable transducer;
   a meter body mount carried in the housing;
   a meter affixed to the meter body mount by a snap-in attachment mechanism, the meter including a display element;
   a cover which seals the meter in the housing; and
   wherein the snap-in attachment mechanism comprises at least one spring clip and at least one detent configured to receive the at least one spring clip and secure the meter to the meter body mount when the cover is removed, wherein the cover applies a force against the meter, wherein the at least one spring clip is configured to be urged against a ramp, and wherein the ramp causes a force to be applied from the meter against the cover when the cover is attached to the housing, whereby the display element is maintained in abutting contact with the cover.

2. The field device of claim 1 wherein the at least one spring clip is carried on one of the meter and meter body mount and wherein the at least one detent is carried on the other of the meter and meter body mount.

3. The field device of claim 1 wherein the at least one spring clip comprises at least two spring clips, and wherein the at least two spring clips are radially opposed to one another.

4. The field device of claim 1 wherein the at least one spring clip comprises four spring clips.

5. The field device of claim 1 wherein the cover includes a transparent region whereby the display element is viewable from outside of the housing.

6. The field device of claim 1 wherein the display element is touch sensitive.

7. The field device of claim 1 wherein the snap-in attachment mechanism generates a force in both a Y and an X axis thereby stabilizing the meter in two dimensions.

8. The field device of claim 1 wherein the snap-in attachment mechanism stabilizes the meter in three dimensions.

9. The field device of claim 1 wherein the spring clip is fabricated in a plastic material.

10. The field device of claim 1 wherein the process variable transducer comprises a process variable sensor.

11. The field device of claim 1 wherein the process variable transducer comprises a process control element.

12. The field device of claim 1 wherein the meter electrically couples to the meter body mount.

13. The field device of claim 12 wherein the meter is electrically coupled to the meter body mount through an electrical connector.

* * * * *